United States Patent [19]
Terasawa

[11] Patent Number: 5,841,155
[45] Date of Patent: *Nov. 24, 1998

[54] SEMICONDUCTOR DEVICE CONTAINING TWO JOINED SUBSTRATES

[75] Inventor: Yoshio Terasawa, Hitachinaka, Japan

[73] Assignee: NGK Insulators, Ltd., Japan

[ * ] Notice: The term of this patent shall not extend beyond the expiration date of Pat. No. 5,591,991.

[21] Appl. No.: 597,228

[22] Filed: Feb. 6, 1996

[30]     Foreign Application Priority Data

Feb. 8, 1995   [JP]   Japan ................................. 7-020416

[51] Int. Cl.$^6$ .................................................. H01L 29/74
[52] U.S. Cl. ........................ 257/138; 257/133; 257/137; 257/139
[58] Field of Search ............................................. 257/133

[56]                References Cited

U.S. PATENT DOCUMENTS

| | | | |
|---|---|---|---|
| 5,313,092 | 5/1994 | Tsuruta et al. ........................... | 257/620 |
| 5,493,134 | 2/1996 | Mehrotra et al. ........................ | 257/137 |
| 5,591,991 | 1/1997 | Terasawa ................................. | 257/137 |

OTHER PUBLICATIONS

Mitlehner et al., "A Novel 8 KV Light–Triggered Thyristor With Overvoltage Self Protection," 1990, pp. 289–294.
Baliga, "Modern Power Devices," 1987, pp. 350–353.
Amato et al., "Comparison of Lateral and Vertical DMOS Specific On–Resistance," 1985, pp. 736–739.
Adler et al., "The Evolution of Power Device Technology," 1984, pp. 1570–1591.
Ishidoh et al., "Advanced High Frequency GTO," 1988, pp. 189–194.
Nishizawa et al., "Analysis of Characteristic of Static Induction Thyristor," 1981, p. 31–38.
Nishizawa et al., "Effects of Gate Structure on Static Induction Thyristor," 1980, pp. 658–661.
Nishizawa et al., "Static Induction Thyristor," 1978, pp. 725–728.
Nishizawa et al., "Field–Effect Transistor Versus Analog Transistor (Static Induction Transistor)," 1975, pp. 185–197.
Nikkei Electronics, 1971, pp. 50–61.

*Primary Examiner*—Olik Chaudhuri
*Assistant Examiner*—Douglas E. Wille
*Attorney, Agent, or Firm*—Parkhurst & Wendel

[57]                 ABSTRACT

A method of manufacturing a joined-type semiconductor device having a gate structure. The semiconductor device includes a first and second semiconductor substrates each having a substrate body, and a first and a second main surfaces which are opposite to each other. A gate structure is formed in the first main surface of the first substrate. A highly-doped semiconductor layer is formed in the first main surface of the second substrate and has an impurity-concentration which is higher than that of the substrate body of the second substrate. The first main surfaces of the two substrates are joined with each other, by subjecting the two substrates to a heat treatment so that impurities in the highly-doped semiconductor layer of the second substrate are driven into the surface region of the first substrate, and a diffusion layer is thereby formed in the first main surface of the first substrate.

6 Claims, 9 Drawing Sheets

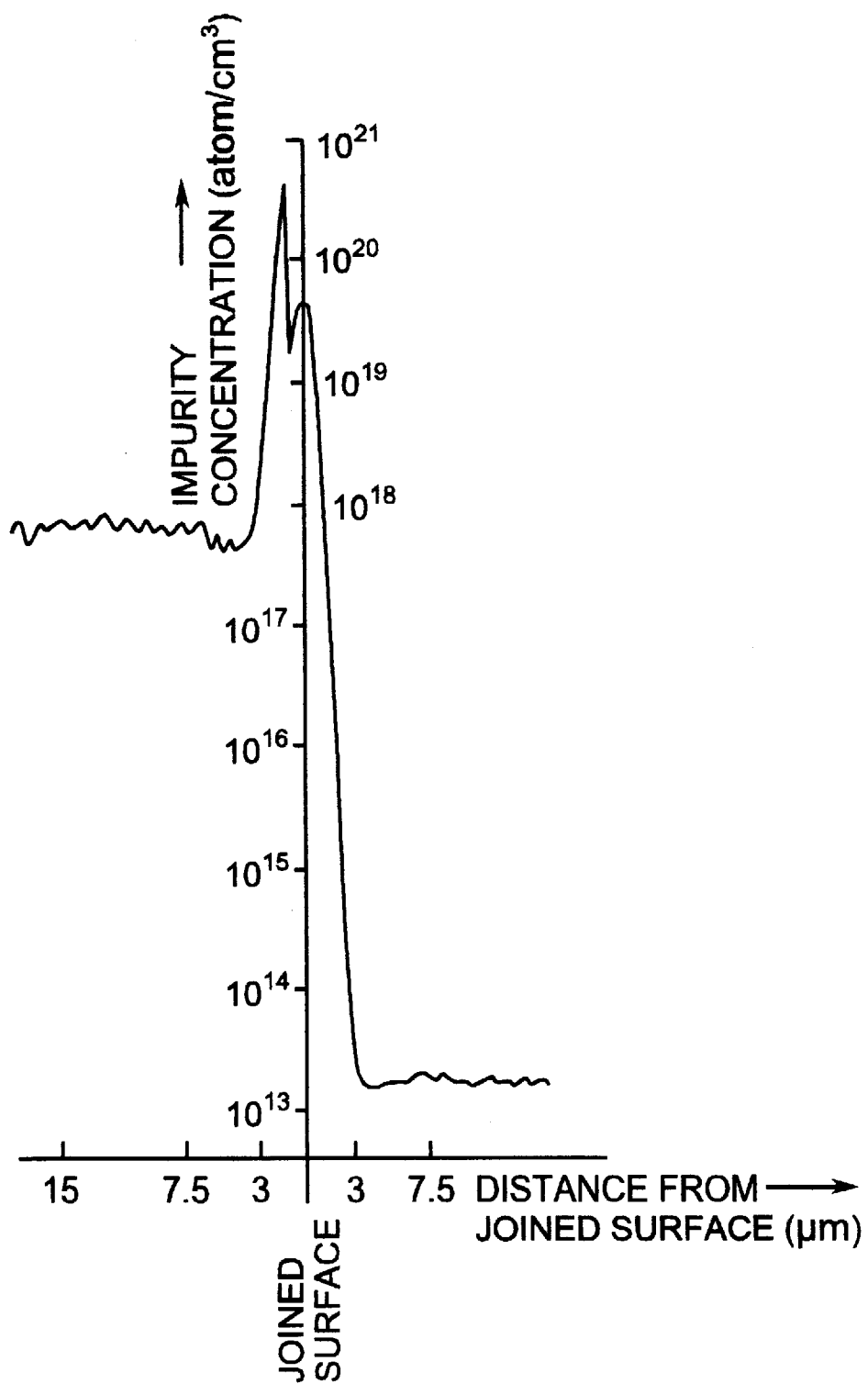

SEMICONDUCTOR DEVICE CONTAINING TWO JOINED SUBSTRATES

BACKGROUND OF THE INVENTION

1. Field of the Invention

The present invention relates to a semiconductor device and a method of manufacturing the same, and more particularly to a self-extinguishing type semiconductor device such as a GTO (gate turn-off) thyristor, an SI (static induction) thyristor, and an IGBT (insulated gate bipolar transistor) power transistor, and to a method of manufacturing such a self-extinguishing type semiconductor device.

2. Description of Related Art

A self-extinguishing type semiconductor device such as GTO thyristor, SI thyristor or IGBT has been widely used as a power semiconductor device and has been described in the following documents.
1. Junichi Nishizawa: "High Power Vertical Type Junction FET having Triode Characteristics", Nikkei Electronics, Sep. 27, 1971, pp. 50–61
2. J. Nishizawa, T. Terasaki and J. Shibata: "Field-Effect Transistor versus Analog Transistor (Static Induction Transistor)", IEEE Trans. on Electron Device, ED-22(4), 185 (1975)
3. J. Nishizawa and K. Nakamura: Physiquee Appliquee, T13, 725 (1978)
4. J. Nishizawa and Y. Otsubo: Tech. Dig. 1980 IEDM, 658 (1980)
5. J. Nishizawa, T. Ohmi, T. Sha and K. Mototani: Technological Report of the Electron and Communication Society, ED81-84 (1981)
6. M. ishidoh, et all "Advanced High Frequency GTO", Proc. ISPSD, 189 (1988)
7. B. J. Baliga, et al: "The Evolution of Power Device Technology", IEEE Trans. on Electron Device, ED-31, 1570 (1984)
8. M. Amato, et al: "Comparison of Lateral and Vertical DMOS Specific On-resistance", IEDM Tech. Dig., 736 (1985)
9. B. J. Baliga: "Modern Power Device", John Wiley Sons, 350 (1987)
10. H. Mitlehner, et al: "A Novel 8 kV Light-Trigger Thyristor with Over Voltage Self Protection", Proc. ISPSD, 289 (1990)

Among the conventional self-extinguishing type semiconductor devices, the GTO thyristor and SI thyristor are known to have an embedded gate-type structure which can be obtained by forming a gate region in a surface of a semiconductor substrate and then providing an epitaxial layer on that surface. In such GTO thyristors and SI thyristor s, since the epitaxial growth has a substrate dependency, the epitaxial layer formed on the surface of the semiconductor substrate, in which the gate region is provided in advance, has such defect that crystal growth on the gate region is different from those on the other portions and a uniform impurity-concentration distribution is not obtained. As a result, it has been difficult to obtain a semiconductor device having good characteristics. In addition, since a the epitaxial growth is a relatively time-consuming process, it lowers the throughput of the semiconductor device. Furthermore, there is still another problem that the conductivity type of the epitaxial layer in a vicinity of the gate region is likely to be inverted. To solve these problems, there ha s been proposed a surface gate-type structure. However, an SI thyristor having the surface gate-type structure cannot have a large reverse voltage and thus, it fails to have a large depletion layer. Accordingly, the SI thyristor with such a structure could not cut off a large current.

When the surface gate-type structure is utilized in a GTO thyristor, there arises a further problem, in addition to those mentioned in the case of SI thyristors, that the gate region cannot have a high impurity-concentration. This results in a low carrier drawing speed and a large turn-off loss and thus, a high frequency property cannot be obtained in the GTO thyristor with this structure.

As a solution for these problems, there has been proposed a serrated gate-type structure. This structure is constituted by forming a groove on a surface of a semiconductor substrate and then providing a gate region in a bottom portion of the groove. However, it is difficult to accurately form a deep groove even by dry etching, and this leads to a poor breakdown voltage. It is also difficult to conduct precise machining in this serrated gate-type structure.

As another solution for the above-mentioned problems, the applicant has proposed, in U.S. patent application Ser. No. 08/407,023 as well as corresponding European Patent Application No. 94 921826.7, a method of manufacturing a semiconductor device comprising the steps of forming recesses or depressions in a surface of a first semiconductor substrate of one conductivity type, forming gate regions of the opposite conductivity type at each bottoms of the recesses by introducing impurities from the bottoms of the recesses, providing gate electrodes on the respective gate regions, and joining a second semiconductor substrate to the surface of the first semiconductor substrate. Semiconductor devices having such a joined or contacted structure are free from various problems caused by epitaxial growth.

Specifically, in a GTO thyristor, since a gate region can include impurities at a high concentration without any difficulty, the carrier drawing speed can be increased correspondingly and thus, the high frequency property can be attained easily. In an SI thyristor, since gate regions having a high impurity-concentration can be uniformly embedded within a semiconductor substrate, the resulting thyristor has a large gate region area in total. With respect to an IGBT having the contacted structure, the cooling efficiency is greatly improved because the structure enables the IGBT to have a cathode covering the entire surface of a semiconductor substrate. As a result, the IGBT with the joined structure allows a flow of large electric current.

The semiconductor device of the joined structure according to the applicant's proposal, wherein first and second semiconductor substrates are joined to each other, provides various advantages as mentioned above. However, since the joined portion between the two semiconductor substrates has a relatively high electric resistance, the semiconductor device of the joined structure suffers from relatively large electric power consumption and heat dissipation amount. As a solution for such a problem, one may think of forming a high impurity concentration region in the opposite surfaces of the two semiconductor substrates to be joined to each other. However, since a gate structure is formed adjacent to the joined portion, a mere formation of a high impurity concentration region in the joined portion of the substrates forming a gate structure requires masking, etching and impurity diffusion processes, thereby lowering the yield and throughput.

Furthermore, in a cascade-type semiconductor device in which carriers are supplied through the joined portion of the two semiconductor substrates, the joining characteristic of the joined portion plays an important role in manufacturing satisfactory devices. If the two substrates are not properly joined, either an ohmic current-voltage characteristic cannot be obtained, or the joining resistance increases thereby giving rise to increased power loss and heat dissipation amount.

DISCLOSURE OF THE INVENTION

Accordingly, it is a primary object of the present invention is to provide a method of manufacturing semiconductor devices, whereby semiconductor devices having a serrated gate-type structure or joined structure can be manufactured with a simplified process, and the electric resistance of the joined portion between two semiconductor substrates can be significantly reduced.

It is another object of the present invention to provide a semiconductor device having a satisfactory joining characteristic, a reduced electric resistance and a ohmic current-voltage characteristic.

A method of manufacturing a semiconductor device according to the present invention comprises the steps of;

preparing a first semiconductor substrate having a substrate body with a first impurity concentration, and a first and a second main surfaces which are opposite to each other, and a second semiconductor substrate having a substrate body with a second impurity, and a first and second main surfaces which are opposite to each other ;

forming a gate structure in said first main surface of the first semiconductor substrate;

forming a highly-doped semiconductor layer having a third impurity concentration in said first main surface of the second semiconductor substrate, said third impurity concentration being higher than the second impurity concentration; and joining the first main surface of the first semiconductor substrate with the first main surface of the second semiconductor substrate, and heating the first and second semiconductor substrates to drive the impurities in the highly-doped semiconductor layer of the second semiconductor substrate into the first main surface of the first semiconductor substrate such that a diffusion layer is formed in the main surface of the first semiconductor substrate, said diffusion layer having a forth impurity concentration higher than said first impurity concentration of the substrate body of the first semiconductor substrate.

According to the present invention, one of two semiconductor substrates to be joined has a first main surface formed with a high impurity concentration region over substantially the entire area. The two semiconductor substrates are joined with each other by a heat treatment so that impurities in the high impurity concentration region in one semiconductor substrate are thermally diffused to the joined portion of the other semiconductor substrate which is formed with a gate structure. As a result, the joined portions of both substrates are formed with high impurity concentration regions without requiring masking or etching process, making it possible to improve the manufacturing throughput.

Furthermore, during joining of the two semiconductor substrates, the thermal diffusion of impurities in one semiconductor substrate toward the other semiconductor substrate serves not only to improve the joining characteristic and the joining strength, but also to attain devices having a reduced electrical resistance at the joined portion and a ohmic current-voltage characteristic. When two semiconductor substrates are to be joined, one may think of providing both substrates with respective high impurity concentration regions. However, since the impurity diffused region has an increased lattice defects, formation of high impurity concentration regions in both substrates results in a substantially doubled lattice defect density to considerably increase the electric resistance of the joined portion. On the contrary, as in the present invention, formation of the high impurity concentration regions in one substrate only serves to reduce the lattice defect density substantially by one half and thereby further reduce the electric resistance. As a result, it is possible, not only to reduce the manufacturing steps, but also to further improve the Is characteristics of the device.

According to an advantageous embodiment of the present invention, the highly-doped semiconductor layer of the second semiconductor substrate is formed to have a same conductive type as a surface region of the first main surface of the first semiconductor substrate, and an impurity concentration higher than that of the surface region of the main surface of the first semiconductor substrate. In this instance, the impurity concentration of the highly-doped semiconductor layer is preferably not less than $1 \times 10^{17}$ atom/cm$^3$, more preferably not less than $1 \times 10^{18}$ atom/cm$^3$.

According to another advantageous embodiment of the present invention, the highly-doped semiconductor layer of the second semiconductor substrate is formed to have an opposite conductive type to that of a surface region of the first main surface of the first semiconductor substrate, and an impurity concentration higher than that of the surface region of the main surface of the first semiconductor substrate. In this instance, the impurity concentration of the highly-doped semiconductor layer is preferably not less than $1 \times 10^{19}$ atom/cm$^3$. with such impurity concentration of the highly-doped semiconductor layer, the first main surface of the first semiconductor substrate may be formed with a diffusion layer of an opposite conductive type to the substrate body of the first semiconductor substrate.

The highly-doped semiconductor layer of the second semiconductor substrate may be formed by any one of ion implanation process, thermal diffusion process, epitaxial growing process, and chemical vapor deposition process.

According to still another advantageous embodiment of the present invention, the impurity of the surface region of the first main surface of the first semiconductor substrate is lower than the second impurity concentration of the substrate body of the second semiconductor substrate. In this instance, the impurities of the highly-doped impurity layer of the second semiconductor substrate are primarily driven into the first main surface of the first semiconductor substrate, due to the difference in impurity concentrations between the substrate body and the surface region of the first surface of the first semiconductor substrate.

The present invention further provides a joined-type semiconductor device comprising:

a first semiconductor substrate having a substrate body with a first impurity concentration, and first and second main surfaces which are opposed to each other, said first main surface having a gate structure formed therein;

a first main electrode formed on the second main surface of the first semiconductor substrate;

a second semiconductor substrate having a substrate body with a second impurity concentration, and first and second main surfaces which are opposed to each other, said first main surface having a highly-doped semiconductor layer formed therein, which has a third impurity concentration higher than the second impurity concentration of the substrate body, said first main surface of the second substrate being joined with said first main surface of the first substrate;

a second main electrode formed on said second main surface of the second substrate; and a diffusion layer formed in the first main surface of the first substrate by thermal diffusion of impurity ions from said highly-doped semiconductor layer into said first main surface of the first substrate, said diffusion layer having impurity concentration higher than said first impurity concentration of the substrate body of the first substrate.

in the joined type semiconductor device according to the present invention, highly-doped impurity layers are formed on both sides of the joined surface so that it is possible to realize a device with a reduced electrical resistance at the joined portion. The semiconductor device according to the present invention can be embodied as SI thyrister, GTO thyrister, MOSFET and IGBT.

BRIEF DESCRIPTION OF THE DRAWINGS

The present invention will now be explained in further detail hereinafter, with reference to some preferred embodiments shown in the accompanying drawings, in which:

FIG. 5 is a graph showing the impurity concentration distribution near the joined portion of the joined-type semiconductor device;

DETAILED DESCRIPTION OF THE PREFERRED EMBODIMENTS

FIGS. 1A through 1E are schematic sectional views showing the successive steps of one preferred embodiment of the method for manufacturing the semiconductor devices according to the present invention, which is directed to the manufacture of SI thyristers.

Figure 1A:
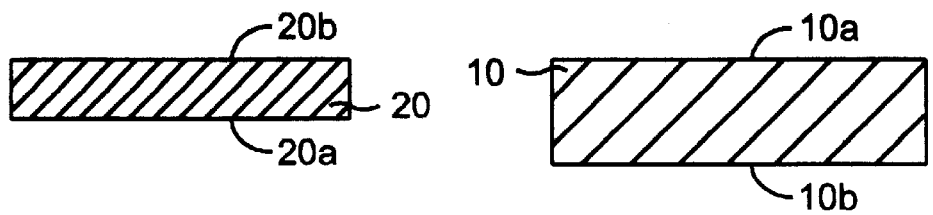
FIGS. 1A through 1E are schematic sectional views showing the successive steps of one preferred embodiment of the method for manufacturing the semiconductor device according to the present invention.
Figure 1B:
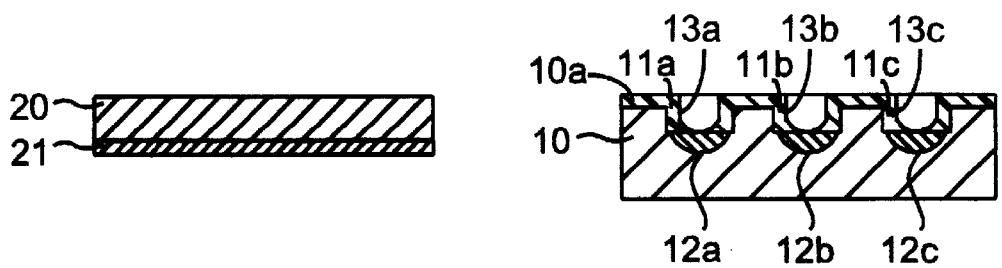
Figure 1C:
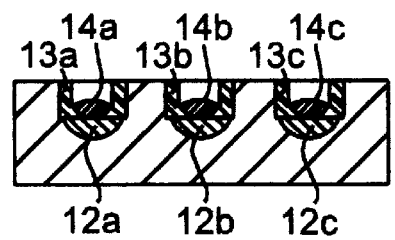

First of all, as shown in FIG. 1A, there are prepared a n$^-$-type first semiconductor substrate 10 and a n$^+$-type second semiconductor substrate 20. The first and second semiconductor substrates 10, 20 have predetermined impurity concentrations which, for example, may be on the order of $10^{15}$ atom/cm$^3$ and $10^{18}$ atom/cm$^3$, respectively. The first semiconductor substrate 10 has a first main surface 10a and a second main surface 10b which is opposite to the first main surface 10a. Similarly, the second semiconductor substrate 20 has a first main surface 20a and a second main surface 20b which is opposite to the first main surface 20a. The first main surface 10a of the first semiconductor substrate 10 is formed with a gate structure. Upon formation of this gate structure, as shown in FIG. 1B, a plurality of grooves 11a, 11b, 11c are formed in the first semiconductor substrate 10 in the first main surface 10a thereof, and in parallel with each other. While three grooves are illustrated in the drawings, the number of the grooves may be determined depending upon the desired characteristics of the device. Subsequently, a heat oxidation layer is formed on the first main surface 10a in its entirety, and diffusion layers 12a, 12b, 12c of the opposite conductive type (p-type) constituting gate regions are formed at the bottom surfaces of the respective grooves 11a, 11b, 11c, after formation of diffusion holes at the bottoms of the grooves 11a, 11b, 11c by a reactive ion etching. Thereafter, as shown in FIG. 1C, a mirror polishing is performed with respect to the first main surface 10a, so as to remove the SiO$_2$ layer which has been formed on the first main surface 10a, and gate electrodes 14a, 14b, 14c comprising tungsten are formed on the respective diffusion layers 12a, 12b, 12c. If it is necessary or desirable to further lower the gate resistance, the SiO$_2$ layer at the bottom of each groove is partly removed.

An ion implantation is performed with respect to the first main surface 20a of the second semiconductive substrate 20 in its entirety, so as to form a highly-doped semiconductive layer 21 of n$^+$-type. This implantation may be carried out by using antimony as impurity, with the implantation depth of from 10Å to 500Å and the impurity concentration of $10^{20}$ atom/cm$^3$, for example. It is of course that the n$^+$-type semiconductive layer 21 may be formed by thermal diffusion process. Also, the n$^+$-type semiconductive layer 21 may be formed by epitaxial growing process or chemical vapor deposition process.

Figure 1D:
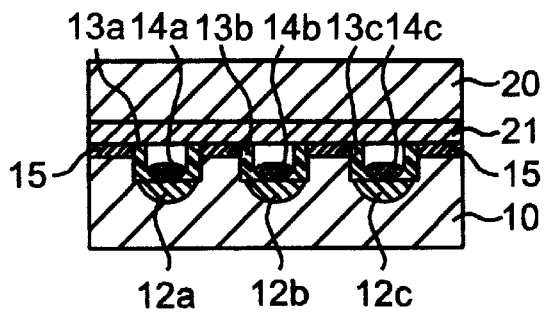
Figure 1E:
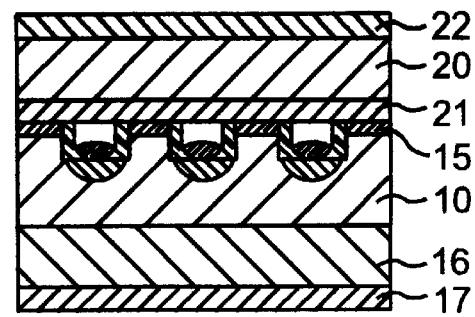
Figure 2A:
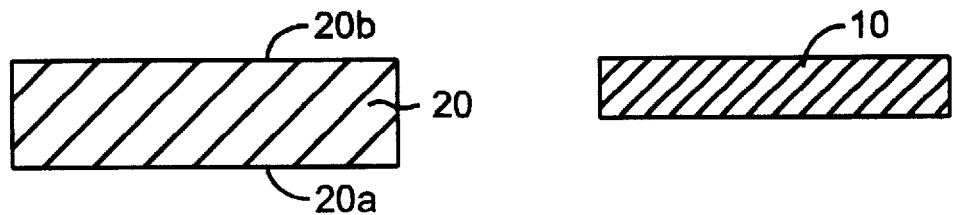
FIGS. 2A through 2D are schematic sectional views showing the successive steps of a modified embodiment of the method for manufacturing the semiconductor device according to the present invention.
Figure 2B:
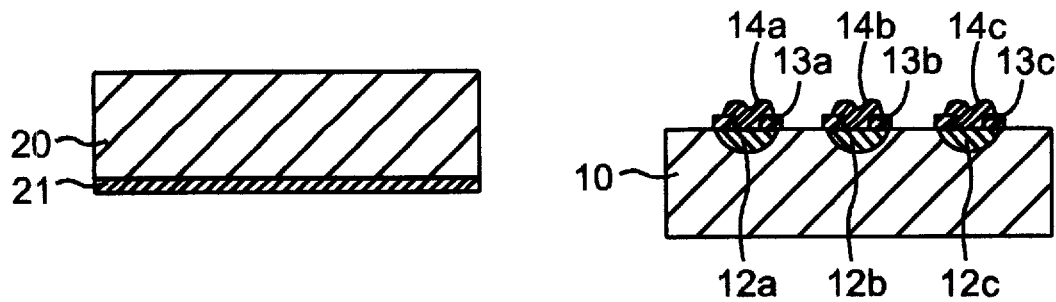
Figure 2C:
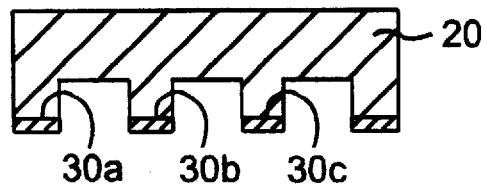
Figure 2D:
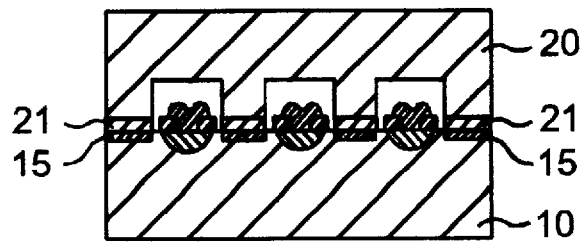

Subsequently, as shown in FIG. 1D, the first main surface 10A of the first semiconductor substrate 10 and the second main surface 20A of the second semiconductor substrate 20 are joined with each other by a heat treatment under an atmosphere of hydrogen or nitrogen gas or water vapor. The heat treatment may be performed at a temperature within a range from 400° C. to 1,200° C. Also, the heat treatment may be performed under application of a pressure from both sides of the two semiconductor substrates 10, 20. The pressure may be within a range from 0.1 kg/cm$^2$ to 100 kg/cm$^2$. By such heat treatment, the impurities of the n$^+$-type semiconductive layer 21 are driven into the first semiconductor substrate 10, thereby forming a highly-doped diffusion layer 15 in the joined region of the first main surface 10A of the first semiconductor substrate 10. During this thermal diffusion, when the impurity concentration of the surface region of the first main surface of the first semiconductor substrate 10 is lower than that of the substrate body of the second semiconductor substrate 20, a larger amount of impurities of the n$^+$-type semiconductive layer 21 are diffused into the first semiconductor substrate 10 than into the substrate body of the second semiconductor substrate 20, so that the n-type impurities can be more effectively driven into the first semiconductor substrate 10, thereby making it possible to form a diffusion layer 15 with a satisfactory impurity concentration. In the first main surface 10A of the first semiconductor substrate 10. Subsequently, as also shown in FIG. 1D, the second main surface 10B of the first semiconductor substrate 10 is formed with a P$^+$layer 16 by a thermal diffusion process. A metal layer, which is comprised of a metal having a high melting temperature, such as tungsten or molybdenum, is then formed on the P$^+$layer 16 as an anode 17 (first electrode). Furthermore, the second main surface 20B of the second semiconductor substrate 20 is subjected to a sputtering of tungsten to form a cathode 22 (second electrode). By performing the above-mentioned successive steps, an SI thyrister is completed.

FIGS. 2A through 2D are schematic sectional views showing the successive steps of a modified embodiment of the method for manufacturing the semiconductor devices according to the present invention. For the sake of convenience, same reference numerals are used to denote the same or corresponding elements shown in FIGS. 1A through 1E.

In this embodiment, the first main surface of the first semiconductor substrate 10 is provided with gate structures. On the other hand, the first main surface of the second semiconductor substrate 20 is subjected to a thermal diffusion in its entirety so as to form a highly-doped impurity concentration region 21. Grooves 30a, 30b, 30c are then formed in the first main surface of the second semiconductor substrate 20 at locations corresponding to the gate structures of the first semiconductor substrate 10, so that the gate structures are accommodated in the grooves 30a, 30b, 30c after the first and second semiconductor substrates 10, 20 are joined to each other. The joining of the first and second semiconductor substrates 10, 20 is performed by a heat treatment which is carried out in the above-mentioned manner. This embodiment is particularly advantageous in that the gate structures can be formed on a flat surface of the first semiconductor substrate 10, hence, with a facilitated formation process.

In the following, explanation will be made of the contact resistance at the joined portion of the first and second semiconductor substrates.

Figure 3A:
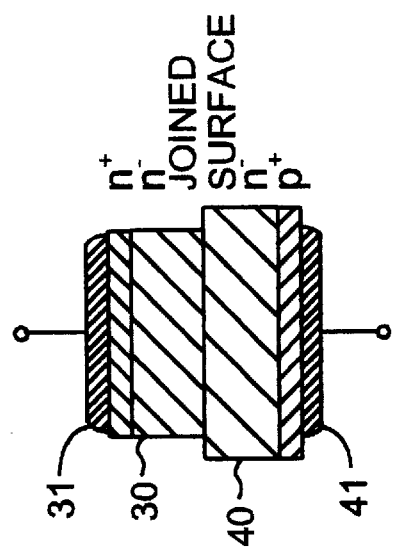
FIGS. 3A, 3B and 3C are schematic sectional view showing sample diodes prepared for confirming the contact resistance at the joined portion of the first and second semiconductor substrates.
Figure 3B:
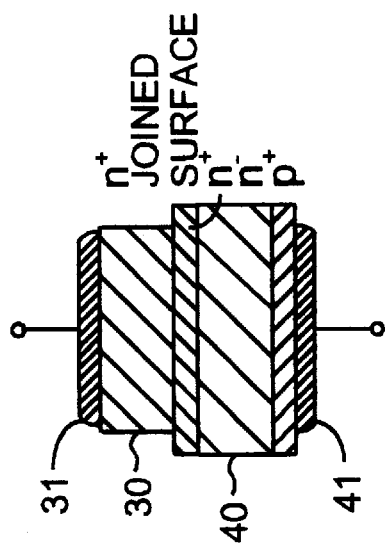
Figure 3C:
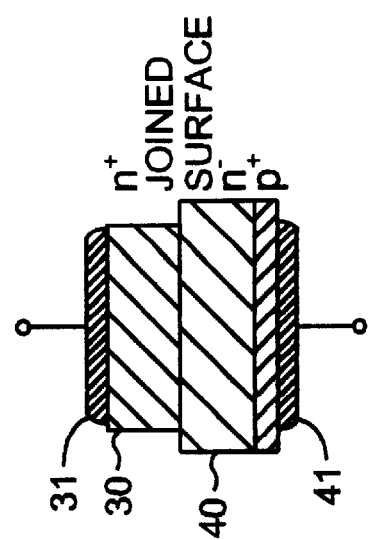

Silicon substrates with different impurity concentrations were prepared and joined with each other by the above-mentioned heat treatment to form samples of pn-junction type diode, which are shown in FIGS. 3A, 3B and 3C.

The sample shown in FIG. 3A is of $[N^+]+[N^-+P^+]$ type, and comprised of a first and a second substrates. The first substrate is a $N^+$ substrate 30 having impurity concentration of $1 \times 10^{18}$ atom/cm$^3$. The second substrate is a $N^-$ substrate 40 having impurity concentration of $1 \times 10^{14}$ atom/cm$^3$ and provided with a $P^+$ layer on its surface which is opposite to the joining surface. The $N^+$ substrate 30 and the $N^-$ substrate 40 are joined to each other to form a pn-junction type diode. In this instance, an anode 31 is formed on the surface of the $N^+$ substrate 30, which is opposite to the joining surface, and a cathode 41 is formed on the $P^+$ layer of the $N^-$ substrate 40.

The sample shown in FIG. 3B is of $[N^+]+[N^++N^-+P^+]$ type, and comprised of a first and a second substrates. The first substrate is a $N^+$ substrate 30 having impurity concentration of $1 \times 10^{18}$ atom/cm$^3$. The second substrate is a $N^-$ substrate 40 having impurity concentration of $1 \times 10^{14}$ atom/cm$^3$ and provided with a $N^+$ layer on its side of the joining surface, having impurity concentration of $1 \times 10^{20}$ atom/cm$^3$, and also with a $P^+$ layer on its surface which is opposite to the joining surface. The $N^+$ substrate 30 and the $N^+$ layer of the substrate 40 are joined to each other to form a joined portion. In this instance also, an anode 31 is formed on the surface of the $N^+$ substrate 30, which is opposite to the joining surface, and a cathode 41 is formed on the $P^+$ layer of the $N^-$ substrate 40.

The sample shown in FIG. 3C is of $[N^++N^-]+[N^-+P^+]$ type, and comprised of a first and a second substrates.

The first substrate is a $N^-$ substrate 30 having impurity concentration of $1 \times 10^{14}$ atom/cm$^3$ and provided on its side of the cathode 31 with a $N^+$ layer having impurity concentration of $1 \times 10^{20}$ atom/cm$^3$. The second substrate is a $N^-$ substrate 40 having impurity concentration of $1 \times 10^{14}$ atom/cm$^3$ and provided with a $P^+$ layer on its surface of the anode 41. The $N^+$ substrate 30 and the $N^-$ substrate 40 are joined to each other to form a joined portion.

For each of the sample diodes shown in FIGS. 3A, 3B and 3C, the contact resistance was measured. To this end, the sample diodes were each connected to a direct current source and applied with positive and negative voltage to measure the current-voltage characteristic. The results of the measurement are shown in FIGS. 4A, 4B and 4C wherein the ordinate indicates the measured current value (mA) and the abscissa indicates the applied voltage (V).

Figure 4A:
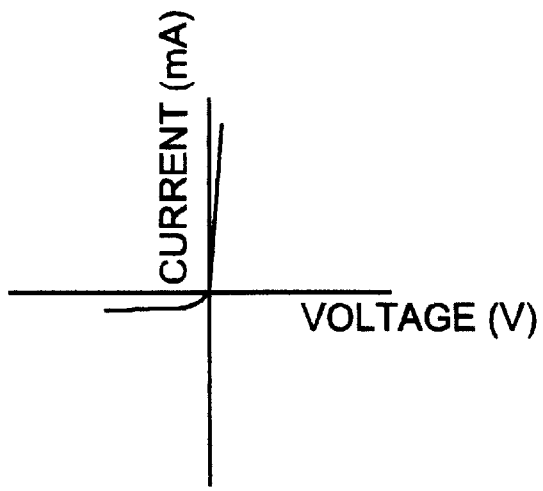
FIGS. 4A, 4B and 4C are graphs showing the current-voltage characteristic of the sample diodes of FIGS. 3A, 3B and 3C, respectively.
Figure 4B:
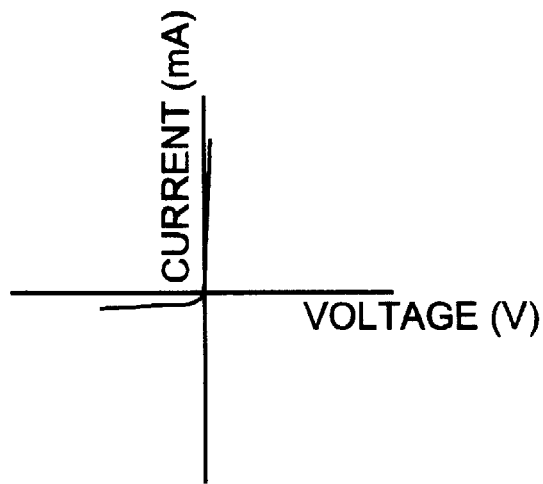
Figure 4C:
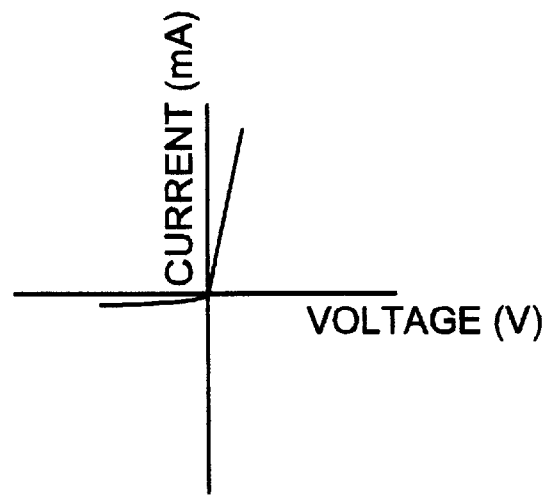

The characteristic of the $[N^+]+[N^-+P^+]$ diode of FIG. 3A is shown in FIG. 4A, which indicates that the current value exhibits a rapid increase at a voltage near 0V. The characteristic of the $[N^+]+[N^++N^-+P^+]$ diode of FIG. 3B is shown in FIG. 4B, which also indicates that the current value exhibits a rapid increase at a voltage near 0V. The characteristic of the $[N^++N^-]+[N^-+P^+]$ diode of FIG. 3C is shown in FIG. 4C, which indicates that the current value exhibits a gradual increase from a voltage near 0V. In the graphs of FIGS. 4A, 4B and 4C, the inclination of the curve corresponds to the contact resistance at the joined portion of the diodes. As can be appreciated from the results of measurement of the current-voltage characteristic, joining of two $N^-$ substrates results in increase in the contact resistance at the joined portion of the semiconductor device. Therefore, in order to reduce the contact resistance at the joined portion of the semiconductor device, it is necessary that at least one of the substrates is of $N^+$-type and has impurity concentration of not less than $1 \times 10^{17}$ atom/cm$^3$, preferably not less than $1 \times 10^{18}$ atom/cm$^3$.

In the following, explanation will be made of the diffusion of impurities by a heat treatment.

The diffusion of impurities by a heat treatment was investigated by preparing a sample comprised of a first and a second substrates. The first substrate has impurity concentration of $1 \times 10^{18}$ atom/cm$^3$, and is formed with a highly-doped impurity layer having impurity concentration of $1 \times 10^{21}$ atom/cm$^3$ on its side of the joining surface. The second substrate has impurity concentration of $1 \times 10^{18}$ atom/cm$^3$, and is joined to the first substrate by a heat treatment. For this sample, the impurity concentration distribution near the joined portion was measured and an analysis was made on the diffusion of impurities by the heat treatment. The result of this measurement is shown in FIG. 5, wherein the ordinate indicates in logarithmic scale the concentration of phosphorus as impurities and the abscissa indicates the distance ($\mu$m) from the joined surface. It is noted that from FIG. 5 that a thin diffusion layer Is formed by the diffusion of impurities over the thickness of approximately 1.5 $\mu$m from the joined surface. Therefore, by performing a heat treatment and thereby joining two substrates only one of which is formed with a highly-doped impurity layer, it is possible to form highly-doped semiconductor layers on both sides of the joined surface to realize a is semiconductor device having a low contact resistance.

Figure 6:
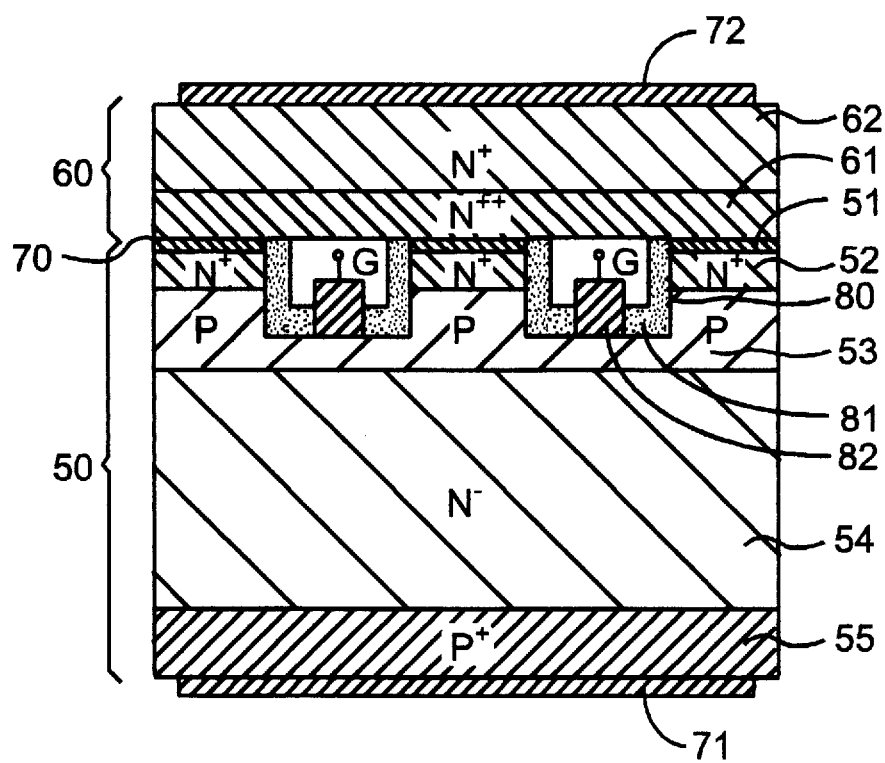
FIGS. 6 through 8 are schematic sectional views respectively showing the joined-type semiconductor devices according to modified embodiments of the present invention.

FIG. 6 shows a joined-type semiconductor device according to a modified embodiment of the invention which is applied to a GTO thyrister.

The thyrister is comprised of a first semiconductor substrate 50 and a second semiconductor substrate 60, which are subjected to a heat treatment and thereby joined to each other at a joined surface 70, as well as a first electrode 71 in the form of an anode, a second electrode 72 in the form of a cathode, and gate structures 80.

As seen in the direction from the joining surface 70 to the first electrode 71, the first semiconductor substrate 50 includes, in sequential order, a thin diffusion layer 51 formed by the heat treatment, a n$^+$-type semiconductor layer 52, a p-type semiconductor layer 53, a n$^-$-type substrate body 54, and a p$^+$-type semiconductor layer 55. Also, as seen in the direction from the joining surface 70 to the second electrode 72, the second semiconductor substrate 60 includes, in sequential order, a highly-doped N$^{++}$-type impurity layer 61 and a N$^+$-type substrate body 62. The p$^+$-type semiconductor layer 55, p-type semiconductor layer 53 and n$^+$-type semiconductor layer 52 of the first semiconductor substrate 50, as well as the N$^{++}$-type impurity layer 61 of the second semiconductor substrate 60 are formed by thermal diffusion process. The gate structures 80 of the first semiconductor substrate 50 can be formed after formation of the above-mentioned layers, by forming recesses by photolithography and etching process, forming oxidation films 81 on the inner surfaces of the recesses, selectively forming through holes in the oxidation films 81, and forming aluminum gate electrodes in the through holes.

Figure 7:
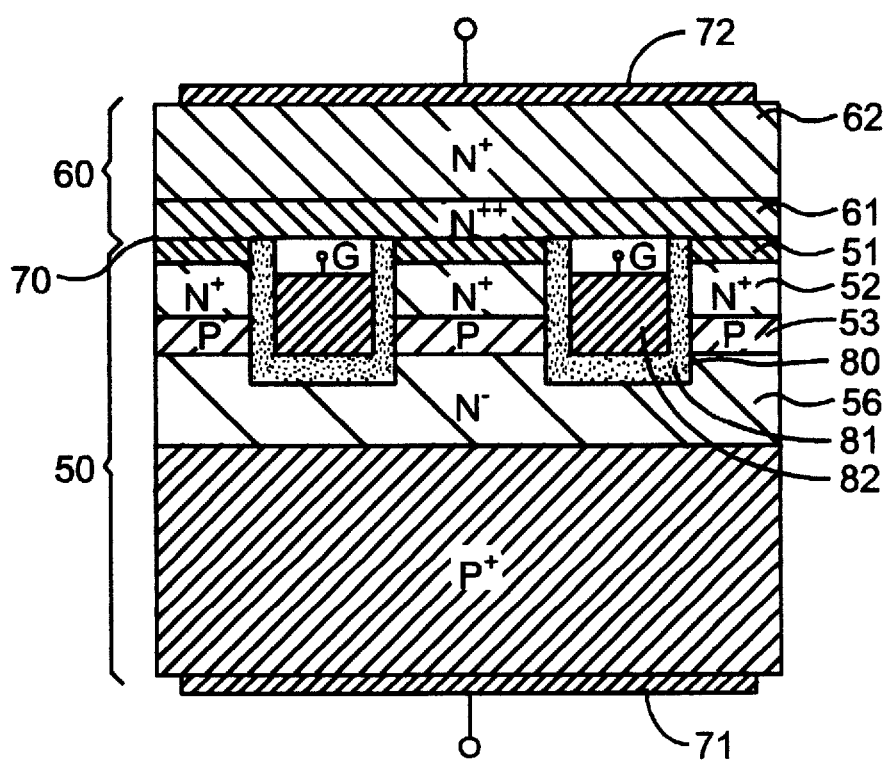

FIG. 7 shows a joined-type semiconductor device according to another modified embodiment of the invention which is applied to a MOSFET.

The MOSFET is comprised of a first semiconductor substrate 50 and a second semiconductor substrate 60, which are subjected to a heat treatment and thereby joined to each other at a joined surface 70, as well as a first electrode 71 in the form of an anode, a second electrode 72 in the form of a cathode, and gate structures 80.

As seen in the direction from the joining surface 70 to the first electrode 71, the first semiconductor substrate 50 includes, in sequential order, a thin diffusion layer 51 formed by the heat treatment, a n$^+$-type semiconductor layer 52, a p-type semiconductor layer 53, a n$^-$-type semiconductor layer 56, and a n$^+$-type substrate body 57. Also, as seen in the direction from the joining surface 70 to the second electrode 72, the second semiconductor substrate 60 includes, in sequential order, a highly-doped N$^{++}$-type impurity layer 61 and a N$^+$-type substrate body 62. The gate structures 80 of the first semiconductor substrate 50 can be formed by forming recesses by photolithography and etching process, forming oxidation films 81 on the peripheral surfaces of the recesses, and forming gate electrodes 82 on the oxidation films 81. The n$^+$-type semiconductor layer 52, p-type semiconductor layer 53 and n$^-$-type semiconductor layer 56 of the first semiconductor substrate 50 are respectively formed by epitaxial growing process.

Figure 8:
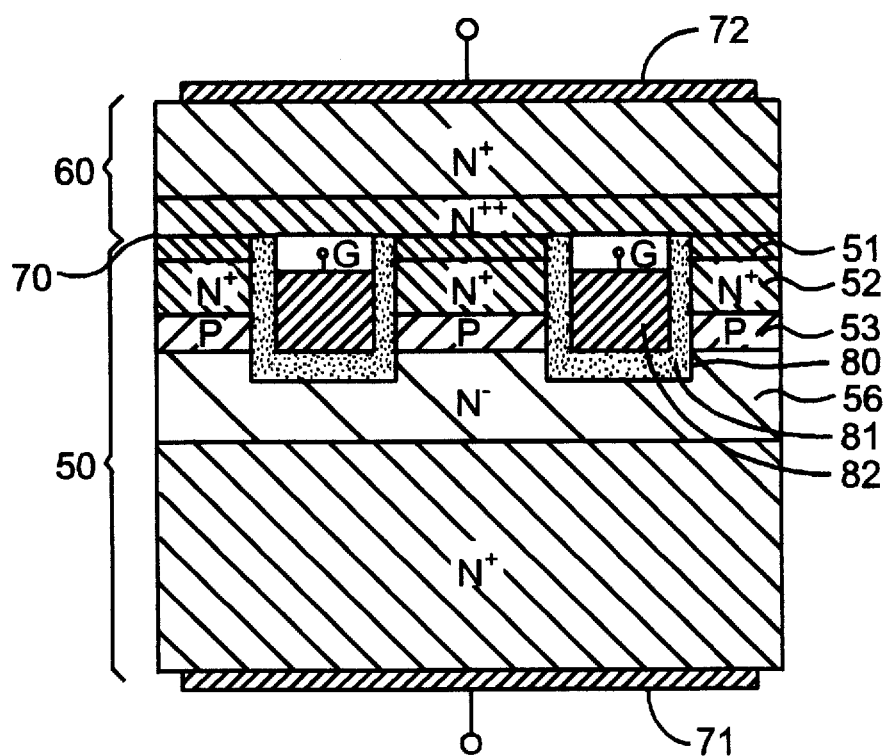

FIG. 8 shows a joined-type semiconductor device according to a further modified embodiment of the invention which is applied to an IGBT.

As in the embodiments of FIGS. 6 and 7, the IGBT according to this embodiment is comprised of a first semiconductor substrate 50 and a second semiconductor substrate 60, which are subjected to a heat treatment and thereby joined to each other at a joined surface 70, as well as a first electrode 71 in the form of an anode, a second electrode 72 in the form of a cathode, and gate structures 80.

As seen in the direction from the joining surface 70 to the first electrode 71, the first semiconductor substrate 50 includes, in sequential order, a thin diffusion layer 51 formed by the heat treatment, a n$^+$-type semiconductor layer 52, a p-type semiconductor layer 53, a n$^-$-type semiconductor layer 56, and a n$^+$-type substrate body 57. Also, as seen in the direction from the joining surface 70 to the second electrode 72, the second semiconductor substrate 60 includes, in sequential order, a highly-doped N$^{++}$-type impurity layer 61 and a N$^+$-type substrate body 62. The gate structures 80 of the first semiconductor substrate 50 are same as those of the embodiment of FIG. 7.

Figure 9:
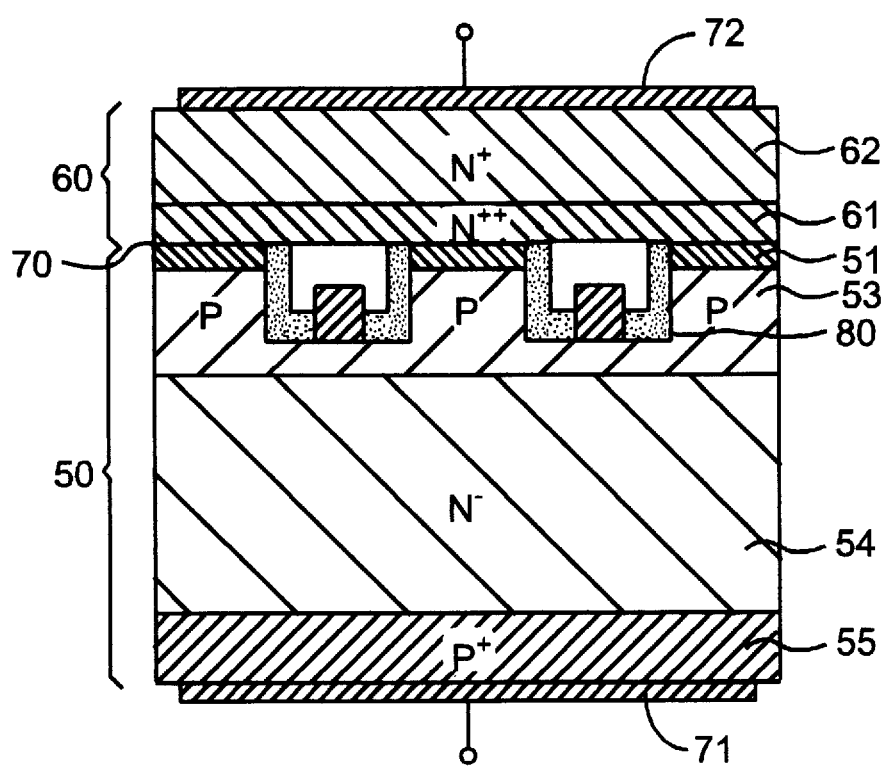
FIG. 9 is a schematic sectional view showing a modified embodiment of the method for manufacturing the joined-type semiconductor devices according to the present invention.

FIG. 9 is a schematic sectional view showing a modified embodiment of the method for manufacturing the GTO thyrister shown in FIG. 6. In the present embodiment, a p-type semiconductor layer 53 is formed on the substrate plate 54 by an epitaxial growing process, and is joined with the highly-doped n-type impurity layer 61 by a heat treatment so as to form an n-type diffusion layer 51 having a high impurity concentration, along the joining surface 70. In this instance, diffusion layer 51 with a sufficient thickness can be directly formed by setting the impurity concentration of the highly-doped Impurity layer 61 so as to be $1 \times 10^{19}$ atom/cm$^3$. The present embodiment can be applied to the manufacture of MOSFET of FIG. 7 and IGBT of FIG. 8.

It will be appreciated from the foregoing detailed description that, in accordance with the present invention, one of the two semiconductor substrates is formed with a highly-doped impurity layer over substantially the entire main surface thereof, the other semiconductor substrate is provided with a gate structure, and the two semiconductor substrates are joined to each other by a heat treatment so that the impurities of the highly-doped impurity layer are thermally diffused into the joined region of the other semiconductor substrate, making it possible to form a current passage with a low resistance without requiring masking or etching process, and thereby improving the throughput of the manufacturing process. The present invention serves to improve the joining characteristic of the joined portion and the joining strength, and allows production of semiconductor devices having a reduced contact resistance and an ohmic current-voltage characteristic.

While the present invention has been explained above with reference to certain preferred embodiments, it is of course that various modifications and/or alternations may be made without departing from the scope of the invention as defined by the appended claims.

I claim:

1. A joined-type semiconductor device comprising:

a first semiconductor substrate having a substrate body with a first impurity concentration, and first and second main surfaces which are opposed to each other, said first main surface having a gate structure formed therein;

a first main electrode formed on the second main surface of the first semiconductor substrate;

a second semiconductor substrate having a substrate body with a second impurity concentration, and first and second main surfaces which are opposed to each other, said first main surface having a highly-doped semiconductor layer formed therein, which has a third impurity concentration higher than the second impurity concentration of the substrate body, said first main surface of the second substrate being joined with said first main surface of the first substrate;

a second main electrode formed on said second main surface of the second substrate;and a diffusion layer formed in the first main surface of the first substrate by thermal diffusion of impurity ions from said highly-doped semiconductor layer into said first main surface of the first substrate, said diffusion layer having impurity concentration higher than said first impurity concentration of the substrate body of the first substrate.

2. The semiconductor device according to claim 1, wherein said semiconductor device is an SI thyrister and said first semiconductor substrate further comprises a further semiconductor layer formed in the second main surface and having an opposite conductive type to that of the substrate body.

3. The semiconductor device according to claim 1, wherein said semiconductor device is a GTO thyrister and said first semiconductor substrate further comprises a first semiconductor layer formed in the second main surface and a second semiconductor layer formed in the first main surface, said first and second semiconductor layers having an opposite conductive type to that of the substrate body, and said diffusion layer having an opposite conductive type to that of the substrate body of said first semiconductor substrate is formed in the said second semiconductor layer.

4. The semiconductor device according to claim 1, wherein said semiconductor device is a GTO thyrister and said first semiconductor substrate further comprises a first semiconductor layer formed in the first main surface and having an opposite conductive type to that of the substrate body, a second semiconductor layer formed in the second main surface and having an opposite conductive type to that of the substrate body, and a third semiconductor layer formed on the first semiconductive layer having a same conductive type to that of the substrate body, and said diffusion layer having a same conductive type to that of the substrate body of said first semiconductor substrate is formed in the said third semiconductor layer.

5. The semiconductor device according to claim 1, wherein said semiconductor device is a MOSFET and said first semiconductor substrate further comprises a first semiconductor layer having a same conductive type to that of the substrate body, a second semiconductor layer formed on the first semiconductor layer and having an opposite conductive type to that of the substrate body, and a third semiconductor layer formed on the second semiconductor layer and having a same conductive type to that of the substrate body,and said diffusion layer having a same conductive type as the substrate body of the first semiconductor substrate is formed in said third semiconductive layer.

6. The semiconductor device according to claim 1, wherein said semiconductor device is an IGBT and said first semiconductor substrate further comprises a first semiconductor layer having an opposite conductive type to that of the substrate body a second semiconductor layer formed on the first semiconductor layer and having a same conductive type to that of the substrate body, and a third semiconductor layer formed on the second semiconductor layer and having an opposite conductive type to that of the substrate body, and said diffusion layer having an opposite conductive type as the substrate body of the first semiconductor substrate is formed in said third semiconductive layer.

* * * * *